(12) United States Patent
Haddad et al.

(10) Patent No.: US 6,646,914 B1
(45) Date of Patent: Nov. 11, 2003

(54) FLASH MEMORY ARRAY ARCHITECTURE HAVING STAGGERED METAL LINES

(75) Inventors: Sameer Haddad, San Jose, CA (US); Richard Fastow, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/096,313

(22) Filed: Mar. 12, 2002

(51) Int. Cl.[7] .............................................. G11C 16/04
(52) U.S. Cl. ...................... 365/185.05; 365/51; 365/63; 365/185.06; 365/185.17; 365/185.26; 365/185.3
(58) Field of Search ..................... 365/185.06, 185.05, 365/185.17, 185.26, 51, 63, 185.3

(56) References Cited

U.S. PATENT DOCUMENTS

| | | | |
|---|---|---|---|
| 4,698,787 A | 10/1987 | Mukherjee et al. | ......... 365/185 |
| 5,120,671 A | 6/1992 | Tang et al. | ............. 437/43 |
| 5,642,311 A | 6/1997 | Cleveland et al. | ........ 365/185.3 |
| 5,646,886 A | * 7/1997 | Brahmbhatt | ............ 365/185.16 |
| 5,656,513 A | 8/1997 | Wang et al. | .......... 438/262 |
| 5,953,250 A | * 9/1999 | Hsu et al. | .............. 365/185.11 |
| 6,064,592 A | * 5/2000 | Nakagawa et al. | .... 365/185.05 |
| 6,552,932 B1 | * 4/2003 | Cernea | .................. 365/185.05 |

* cited by examiner

Primary Examiner—Richard Elms
Assistant Examiner—Pho Luu

(57) ABSTRACT

A memory array includes a plurality of sets of transistors, each set including a pair of transistors in series. Each such pair of transistors is connected between a pair of adjacent bit lines. Each of the pair of transistors in each set is associated with a different one of an adjacent pair of word lines. The array is configured by providing substantially strait elongated source/drain regions in side-by-side, parallel relation. Each bit line has a zigzag configuration and connects to a pair of adjacent source/drain regions in alternating manner along the bit line length.

13 Claims, 6 Drawing Sheets

FLASH MEMORY ARRAY ARCHITECTURE HAVING STAGGERED METAL LINES

BACKGROUND OF THE INVENTION

1. Field of the Invention

This invention relates generally to programmable semiconductor memories, and more particularly, to the configuration of a memory device incorporating flash memory cells.

2. Cross-Reference to Related Case

This case is related to FLASH MEMORY ARRAY ARCHITECTURE AND METHOD OF PROGRAMMING, ERASING, AND READING THEREOF, invented by Sameer Haddad, filed Dec. 11, 2001, Ser. No. 10/013,993.

3. Discussion of the Related Art

A type of programmable memory cell is commonly referred to as a flash memory cell. Such flash memory cell may include a source and a drain formed in a silicon substrate, or in a well that is formed in the silicon substrate. The flash memory cell includes a stacked gate structure formed on the silicon substrate. The region of the silicon substrate beneath the stacked gate structure is known as the channel region of the flash memory cell.

The stacked gate structure of the flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as a tunnel oxide layer. A memory cell of this type is shown and described in U.S. Pat. No. 4,698,787, "Single Transistor Electrically Programmable Memory Device and Method", issued to Mukheree et al. on Oct. 6, 1987.

Programming operations on a flash memory cell involve the application of a relatively large constant voltage to the drain of the flash memory cell wile an even larger voltage is applied to the control gate. During such a programming operation, the source of the flash memory cell is maintained at a ground level or a zero voltage level in relation to the voltages applied to the control gate and drain. The high constant voltage applied to the control gate raises the voltage potential of the floating gate to a high level at the start of the programming operation. Such a high voltage potential on the floating gate attracts the electrons floating through the channel region. Under these conditions, electrons in the channel region having sufficiently high kinetic energy migrate through the tunnel oxide layer and onto the floating gate. This phenomenon is commonly referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of the flash memory cell to cause conduction through the channel region during the read operation on the flash memory cell.

FIG. 1 illustrates what is known as a NOR memory array 100. The array includes individual cells C1–C16 made up of respective MOS field effect transistors T1–T16, each of the transistors including a source S, a drain D, a floating gate FG, and a control gate CG as described above, bit lines B0–B3, and word lines W0–W3. The cells are connected in an array of rows 102, 104, 106, 108 and columns 110, 112, 114, 116, with the control gates of the cells in a row (for example row 104) being connected to a respective word line (W1) and the drains of the cells in a column (for example column 114) being connected to a respective bit line (B2). The sources of the cells in a column are connected together. It will be understood that FIG. 1 shows only a small portion of the array, which portion is repeated to form the entire array.

A cell can be programmed by applying programming voltages of approximately 9–10 volts to the control gate, approximately 5 volts to the drain, and grounding the source. These voltages cause hot electrons to be injected from a drain depletion region into the floating gate. Upon removal of the programming voltages, the injected electrons are trapped in the floating gate and create a negative charge therein that increases the threshold of the cell to a value in excess of approximately 4 volts.

A cell can be read by applying a voltage of approximately 5 volts to the control gate, applying approximately 1 volt to the bit line to which the drain is connected, grounding the source, and sensing the bit line current. If the cell is programmed and the threshold voltage is relatively high (4 volts), the bit line current will be zero or relatively low. If the cell is not programmed or is erased, the threshold voltage will be relatively low (2 volts), the control gate voltage will enhance the channel, and the bit line current will be relatively high.

A cell can be erased in several ways. In one approach, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of –10 volts to the control gate, applying 5 volts to the source and allowing the drain to float can also erase the cell. Another method of erasing a cell is by applying 5 volts to the P well and –10 volts to the control gate while allowing the source and drain to float.

The array of FIG. 1 is shown in layout form in FIG. 2. The layout structure includes elongated, substantially parallel source/drain regions 120, 122, 124, 126, each made up of alternating sources S and drains D, a channel region CR connecting each adjacent source and drain as shown. Each bitline B0–B3 is associated with a respective source/drain region 120, 122, 124, 126, running therealong and contacting the individual drains of its associated source/drain region by means of contacts 130. The word lines of the structure are shown at W0–W3, and are orthogonal to the bit lines B0–B3. The sources S of the source/drain regions 120, 122, 124, 126 are connected together in a direction parallel to the word lines W0–W3 as shown in FIG. 2, being formed by a self-aligned-source (SAS) process as for example disclosed in U.S. Pat. No. 5,120,671, "Process For Self Aligning A Source Region With A Field Oxide Region And A Polysilicon Gate", issued to Tangetal. on Jun. 9, 1992. Cells C1–C16 are formed at the intersections of word lines W0–W3 and bit lines B0–B3. Approximately every 20 bit lines across the array 100, each self aligned source SAS is brought into contact with conductive lines CL running substantially parallel to the bit lines B0–B3 by means of contacts 132. The conductive lines CL are connected together by a connecting line 134 to which appropriate voltage Vss may be applied so that a common voltage may be applied to all the sources S.

The NOR architecture provides several advantages. With the ability to access each cell individually, a high level of drive current can be achieved so that the read speed is high.

Furthermore, this architecture lends itself to reasonable device scaling, i.e., minimizing of the feature sizes, i.e., for example, minimizing of dimensions of active regions, isolation regions, word and bit lines.

However, such an architecture is subject to problems. For example, as described in U.S. Pat. No. 5,656,513, "Nonvolatile Memory Cell Formed Using Self-Aligned Source Implant" issued to Wang et al., issued Aug. 12, 1997 (assigned to the present Assignee), in the self-aligned-source process, a selective etch is undertaken to etch away tunnel oxide and field oxide between the word lines, this etch aligning with the edges of the word lines. While this etch is selective in that it etches the oxide at a much higher rate than the polysilicon word lines or silicon, it is not totally selective. Portions of the silicon of the source, as well as portions of the exposed polysilicon of the word lines, are etched away. The etch operates on tunnel oxide at the same rate as field oxide. Field oxide is typically considerably thicker than tunnel oxide. By the time the inter source portions of field oxide are removed, not only has the etch removed the gate oxide overlying the source, but it has also removed a portion of the silicon substrate in the source, producing a gouge therein, which can significantly affect device performance. Furthermore, the process itself is relatively complicated, requiring implantation in the exposed silicon to provide proper connection of cell sources, along with achieving low resistance.

Furthermore, the conductive lines CL, which contact the self aligned sources SAS, being spaced for example every 20 bit lines apart across the array, use up valuable space in the layout, which works against further miniaturization of the overall array.

Another problem is that of column leakage. Because of manufacturing tolerances, during the erase process, some cells become overerased before other cells become sufficiently erased. The floating gates of the overerased cells are either completely or partially depleted of electrons and have a very low negative charge or become positively charged. The overerased cells can function as depletion mode transistors that cannot be turned off by normal operating voltages applied to their control gates and introduce leakage current to the bit line during subsequent program and read operations. The slightly overerased cells can introduce varying amounts of leakage current to the bit line depending upon the extent of overerasure.

More specifically, during program and read operations only one word line is held high at a time, while the other word lines are grounded. However, because a positive voltage is applied to the drains of all the cells, if the threshold voltage of an unselected cell is very low, zero or negative, a leakage current will flow through the source, channel and drain of that cell.

Additionally, it is desirable to decrease the size of conventional memory cells in order to increase their density in the memory array. This may be accomplished by decreasing the dimensions of the floating gates and therefore the dimensions of the gate stack. However, as the dimensions of the gate stack decrease, the length of the channel regions decreases. As the source and drain of a conventional cell become closer, short channel effects may cause the threshold voltage of the cell to drop below a desired level, leading to undesirable leakage of current through the cell.

FIG. 3 illustrates what is known as a NAND memory array 200. The array again includes individual cells C1–C16 made up of respective MOS field effect transistors T1–T16, each of the transistors T1–T16 including a source S, a drain D, a floating gate FG, and a control gate CG as described above. The array 200 is made up of a plurality of memory cell columns or strings 202, 204, 206, 208, each of which has a number of memory cell transistors (column 202, T1, T5 . . . ), for example, 16 such transistors, connected in series. Each string is connected through a select gate SG1 at one end thereof to a bit line B0–B3, and, through another select gate SG2 at the other end thereof to a source line SL0–SL3. The control gates CG of the cells in a row 210, 212, 214, 216 are connected to a respective word line W0–W3. Again, it will be understood that FIG. 3 shows only a small portion of the array, which portion is repeated to form the entire array.

The individual cells are programmed and erased by applying voltages to the source, drain and control gate thereof as described above. In reading the state of an individual ("selected") cell in a string, the select gates of that string are turned on, and the control gates of each of the cells in that string other than the selected cell, i.e., the "unselected" cells, are driven sufficiently high to turn on each of those transistors, whether they are programmed or not. Then, a lower level of voltage is applied to the control gate of the selected cell, which level would be sufficient to turn on the transistor of that cell if the cell were unprogrammed, but insufficient to turn on that cell if the transistor of that cell were programmed. Data stored in the selected cell is then read out depending on whether the selected cell is turned on or off, i.e., whether current flows or does not flow through the memory cell string.

Since the transistors in each string are connected in series, this array does not require the self-aligned-source process as used in the NOR array configuration. However, because all of the non-selected transistors in a strings are rendered conductive in the process of reading the state of a selected cell, the drive current for reading an individual cell is lower than in the NOR array, resulting in cell read speed being substantially slower than in the NOR array configuration.

What is needed is a memory array wherein high access speed to individual cells is achieved, wherein the problems associated with the self aligned source process are avoided, wherein column leakage and short channel effect are reduced, and which readily lends itself to scaling.

SUMMARY OF THE INVENTION

The present memory array includes a plurality of bit lines and a plurality of word lines orthogonal to the bit lines. The array includes a plurality of sets of transistors, each set including a pair of transistors in series, each pair connected between a pair of adjacent bit lines, with each one of the pair being associated with a different word line. In the layout of the array, a plurality of source/drain regions of substantially straight configuration are included, each comprising alternating source and drain regions along its length. Each bitline, zigzag in configuration, is connected to two source/drain regions in alternate manner along the bitline length.

The present invention is better understood upon consideration of the detailed description in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 4:
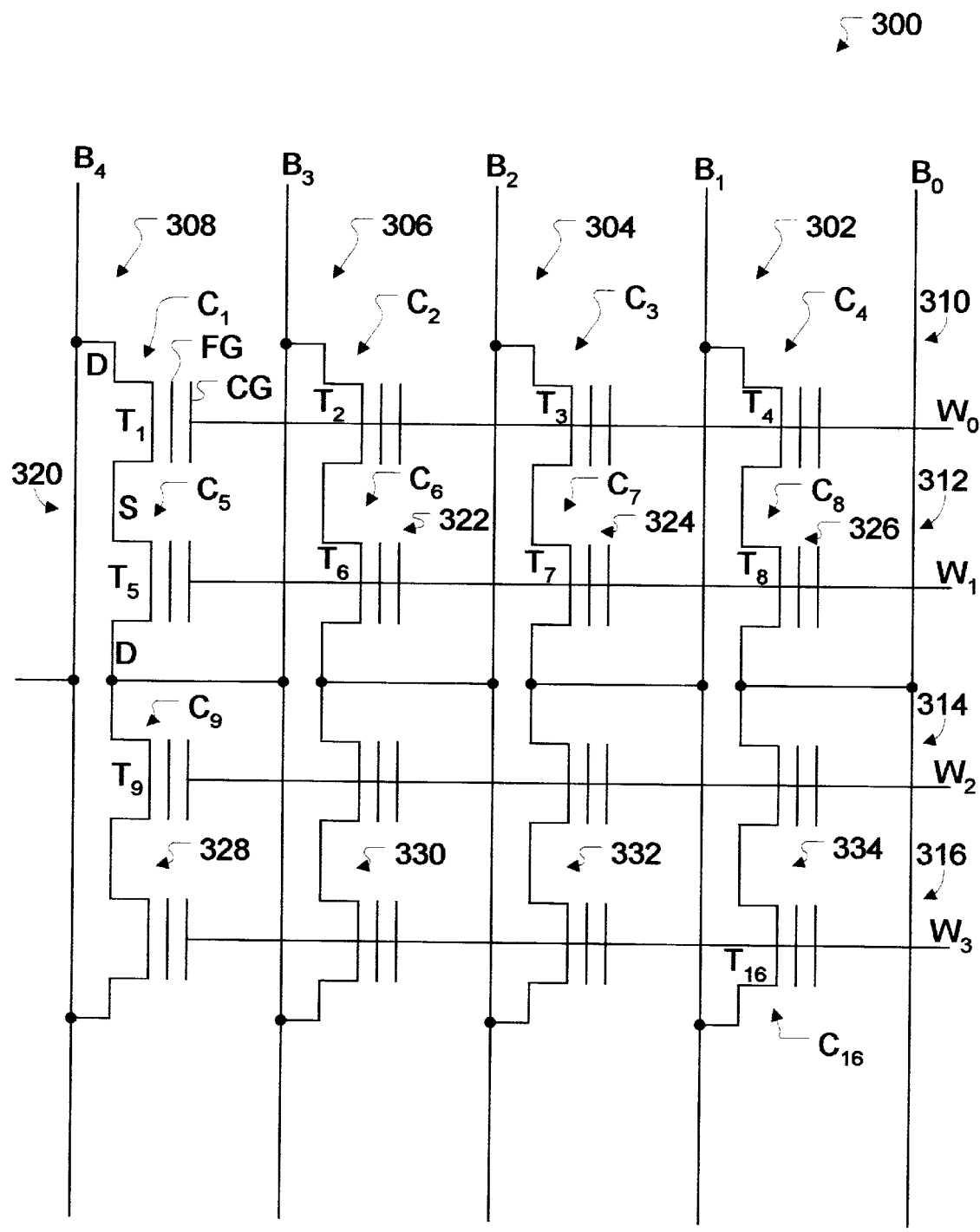
FIG. 4 is a schematic view of the present memory array.

FIG. 4 illustrates the memory array 300 of the present invention. The array 300 includes individual cells C1–C16 made up of respective MOS field effect transistors T1–T16, each of the transistors including a source S, a drain D, a floating gate FG and a control gate CG as described above. The cells C1–C16 are arranged in an array of rows columns 302, 304, 306, 308 and rows 310, 312, 314, 316. The array 300 includes a plurality of sets 320, 322, 324, 326, 328, 330, 332, 334 of transistors, each set (for example set 326) including a pair of transistors (T4, T8) in series. The drain of one of the pair of transistors in series (for example T4 of the pair T4, T8) is connected to a bit line (B1), and the drain of the other of the pair of transistors (T8 of the pair T4, T8) is connected to a next adjacent bit line (B0), with the transistors (T4, T8) of the pair having a common source, so that each such set of series-connected transistors is connected between adjacent bit lines (B1, B0). One of each pair of transistors (for example T4 of the pair T4, T8) has its control gate connected to a word line (W0), and the other of each such pair of transistors (T8) has its control gate connected to the next adjacent word line (W1).

Figure 5:
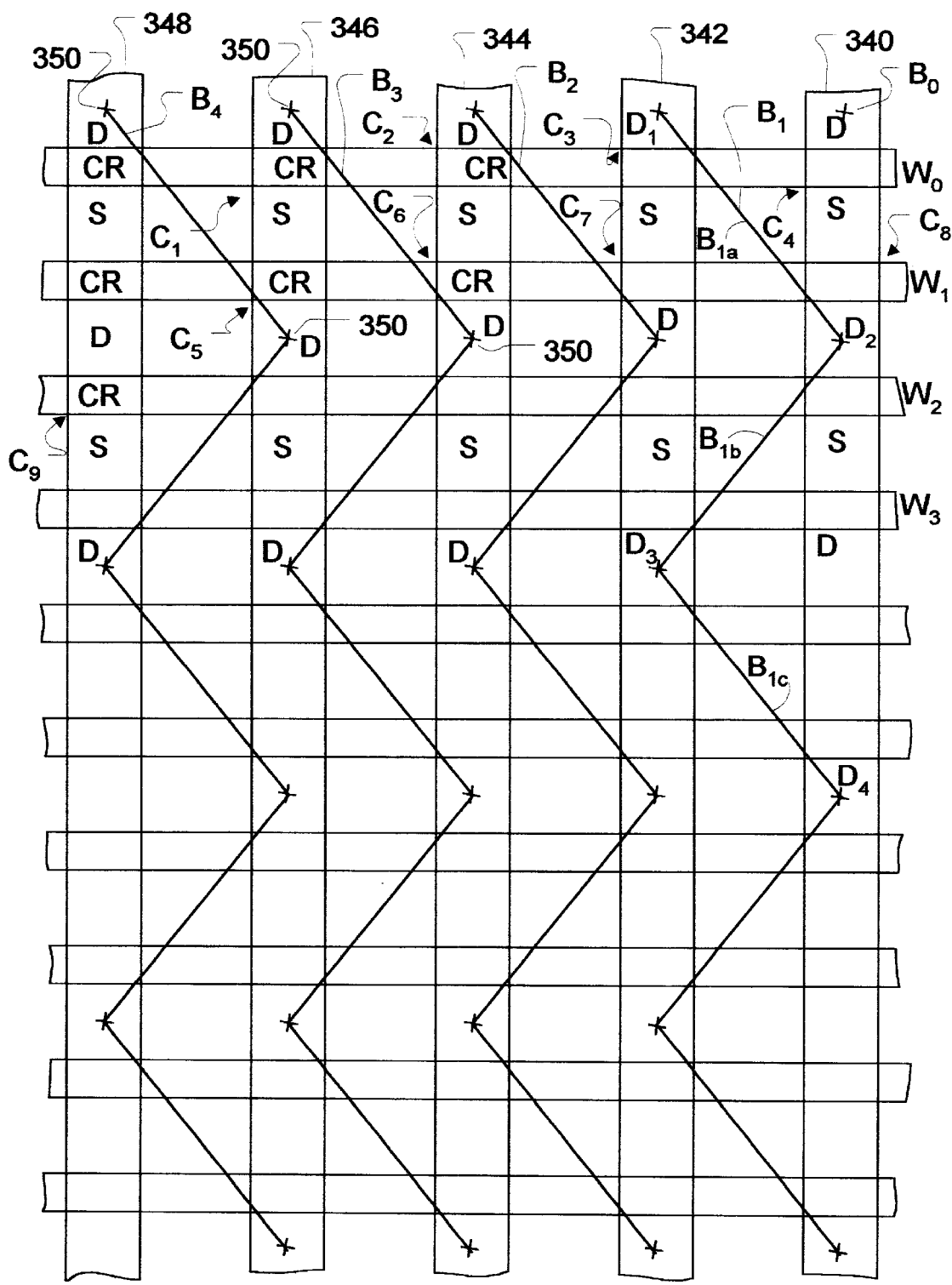
FIG. 5 is a plan view of a layout of the array of FIG. 4.

The array 300 of FIG. 4 is shown in layout form in FIG. 5. The layout structure includes a plurality of elongated, substantially straight source/drain regions 340, 342, 344, 346, 348 in side-by-side, parallel relation, which may be formed in a single step by use of a source/drain implant mask. Each region comprises alternating sources S and the drains D along its length, with a channel region CR connecting each adjacent source and drain. Each word line W0–W3 is in operative association with the transistors of a row of cells. The bit lines B0–B4 are metal and are orthogonal to the word lines W0–W3. Each bit line B0–B3, as described above, is made of the connected segments (for example B0a, B0b, B0c, etc.), with each segment being non-aligned with an adjacent segment, so that each such bit line is of a zigzag configuration. Each of the bit lines is connected to the drains of the source/drain regions by contacts 350 as shown in FIG. 5. That is, for example, bit line B0 is connected to the drain D1 of the source/drain region 342, and then connects to a drain D2 of adjacent source/drain region 340. Moving further along the length of the bit line B0, it then is connected to a drain D3 of the source/drain region 342, and a drain D4 of the source/drain region 340. It will be seen that each bit line connects to two adjacent source/drain regions in alternating manner along the bit line length.

The programming of cells will be illustrated in accordance with the following table.

| Cell selected | B3 | B2 | B1 | B0 | W0 | W1 | W2 | W3 |
|---|---|---|---|---|---|---|---|---|
| C3 | Floating | 5 V | 0–.5 V | Floating | ≦7 V | 9.5 V | 0 V | 0 V |
| C4 | Floating | Floating | 5 V | 0 V | ≦7 V | 9.5 V | 0 V | 0 V |
| C7 | Floating | 0–.5 V | 5 V | Floating | 9.5 V | ≦7 V | 0 V | 0 V |
| C8 | Floating | Floating | 0–.5 V | 5 V | 9.5 V | ≦7 V | 0 V | 0 V |

Figure 6:
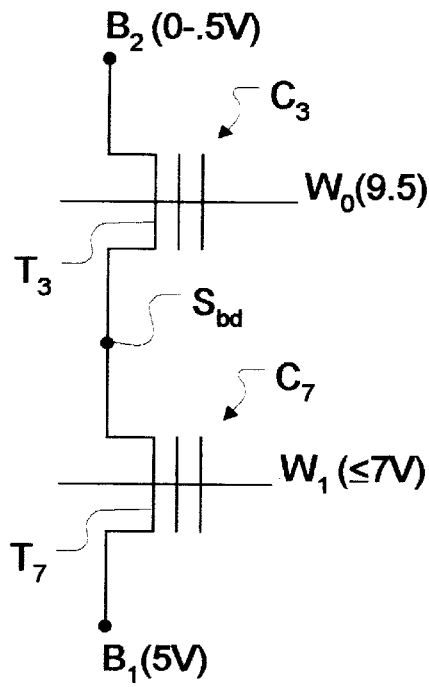
FIG. 6 is a schematic view of a series-connected pair of transistors of the array of FIG. 4, illustrating programming of a cell.

The programming of cell C7 is more specifically shown in FIG. 6. The voltage applied to word line W0 must be sufficiently high to pull the node Sbd to a low enough voltage to provide (1) a sufficiently high source-to-drain voltage Vsd across the cell for fast hot-carrier programming and (2) a back bias, to control the short channel effect.

It will be seen that the programming of the other cell C3 of this pair requires the switching of all voltages shown in FIG. 6.

The reading of cells will be illustrated by the following example in accordance with the following table:

| Cell selected | B3 | B2 | B1 | B0 | W0 | W1 | W2 | W3 |
|---|---|---|---|---|---|---|---|---|
| C3 | Floating | 1 V | 0–.5 V | Floating | 2.5 V | 4.5 V | 0 V | 0 V |
| C4 | Floating | Floating | 1 V | 0–.5 V | 2.5 V | 4.5 V | 0 V | 0 V |

-continued

| Cell selected | B3 | B2 | B1 | B0 | W0 | W1 | W2 | W3 |
|---|---|---|---|---|---|---|---|---|
| C7 | Floating | 0–.5 V | 1 V | Floating | 4.5 V | 2.5 V | 0 V | 0 V |
| C8 | Floating | Floating | 0–.5 V | 1 V | 4.5 V | 2.5 V | 0 V | 0 V |

Figure 7:
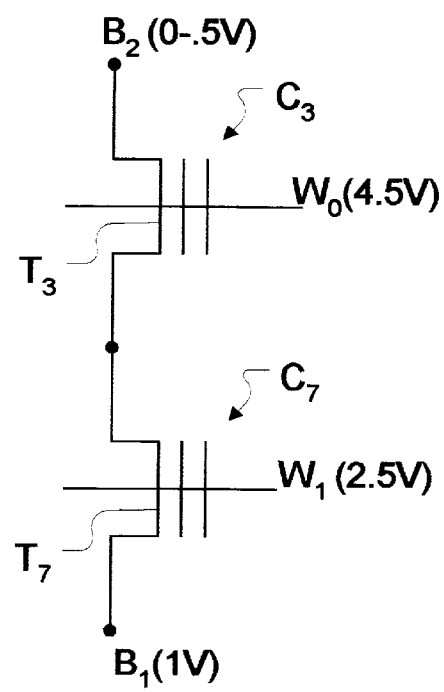
FIG. 7 is a schematic view of a series-connected pair of transistors of the array of FIG. 4, illustrating read of a cell.

The reading of cell C7 is specifically illustrated in FIG. 7. The word line W0 is driven sufficiently high to turn on the transistor T3 of cell C3 (in series with the transistor T7 of the cell C7 to be read). A lower voltage is applied to the word line W1 connected to the cell C7, this voltage being sufficient to turn on the transistor T7 if the cell C7 is unprogrammed, but insufficient to turn on the transistor T7 if the cell C7 is programmed. Data stored in the selected cell C7 is then read out depending on whether current flows or does not flow through the series-connected transistors T3, T7 of cells C3, C7.

It will be seen that the reading of the other cell C3 of this pair requires the switching of voltages shown in FIG. 7.

During erase, the P well in which the source and drain are formed is held at a positive potential, the gate is held at a negative potential, and the source and drain are allowed to float, so that Fowler-Nordheim tunneling is provided from the floating gate through the thin tunnel oxide layer to erase the cell.

It will be understood that while specific voltages for programming and read are provided in the above examples, depending on the specific parameters of the array, these voltages can be optimized for reduction of background leakage during the programming and read operations. For example, voltage applied to bit line B2 can be adjusted to up to for example 0.5V during programming and/or read to shut off unwanted background leakage.

Figure 1:
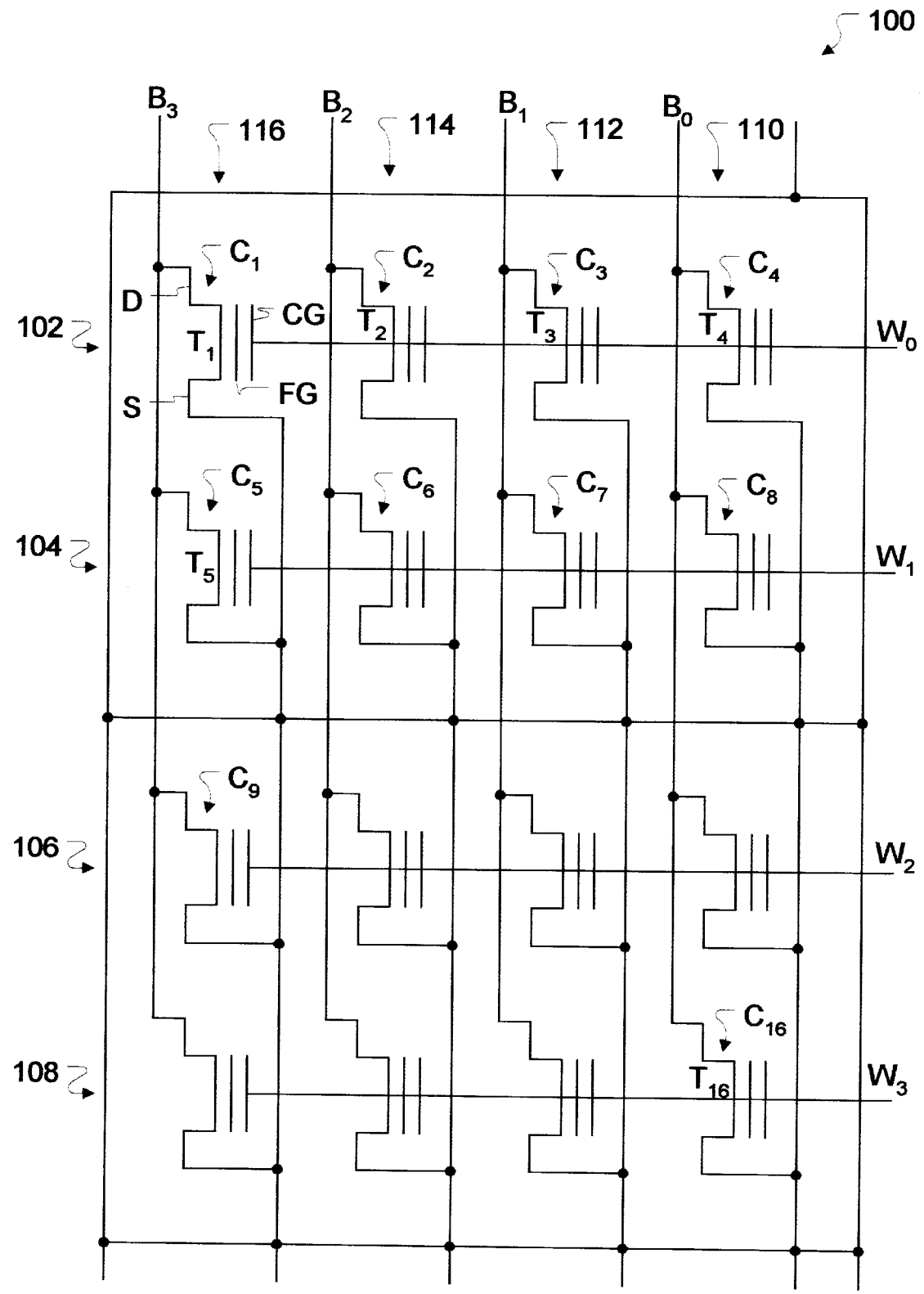
FIG. 1 is a schematic view of a typical prior art NOR memory array.
Figure 2:
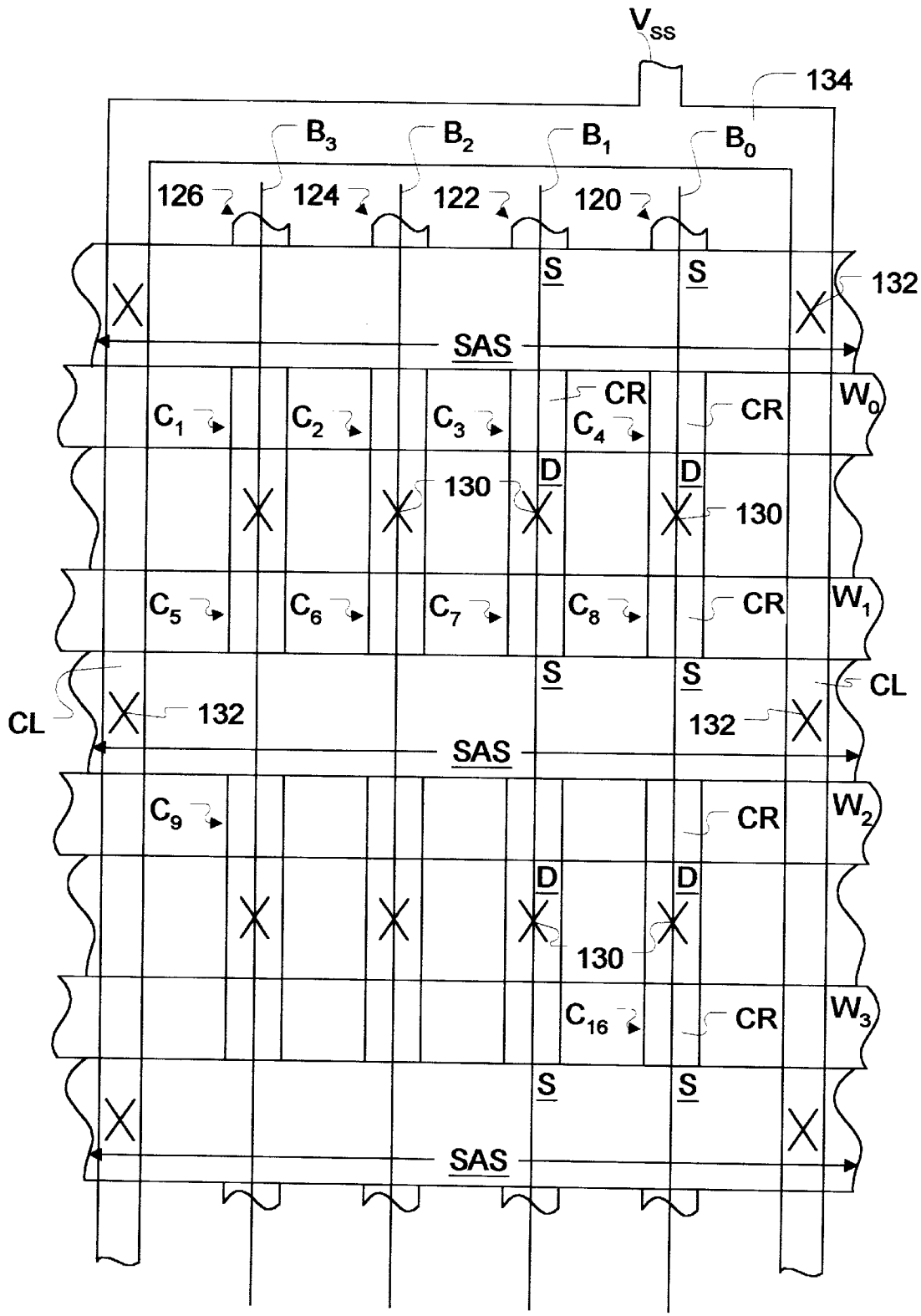
FIG. 2 is a plan view of a layout of the array of FIG. 1.
Figure 3:
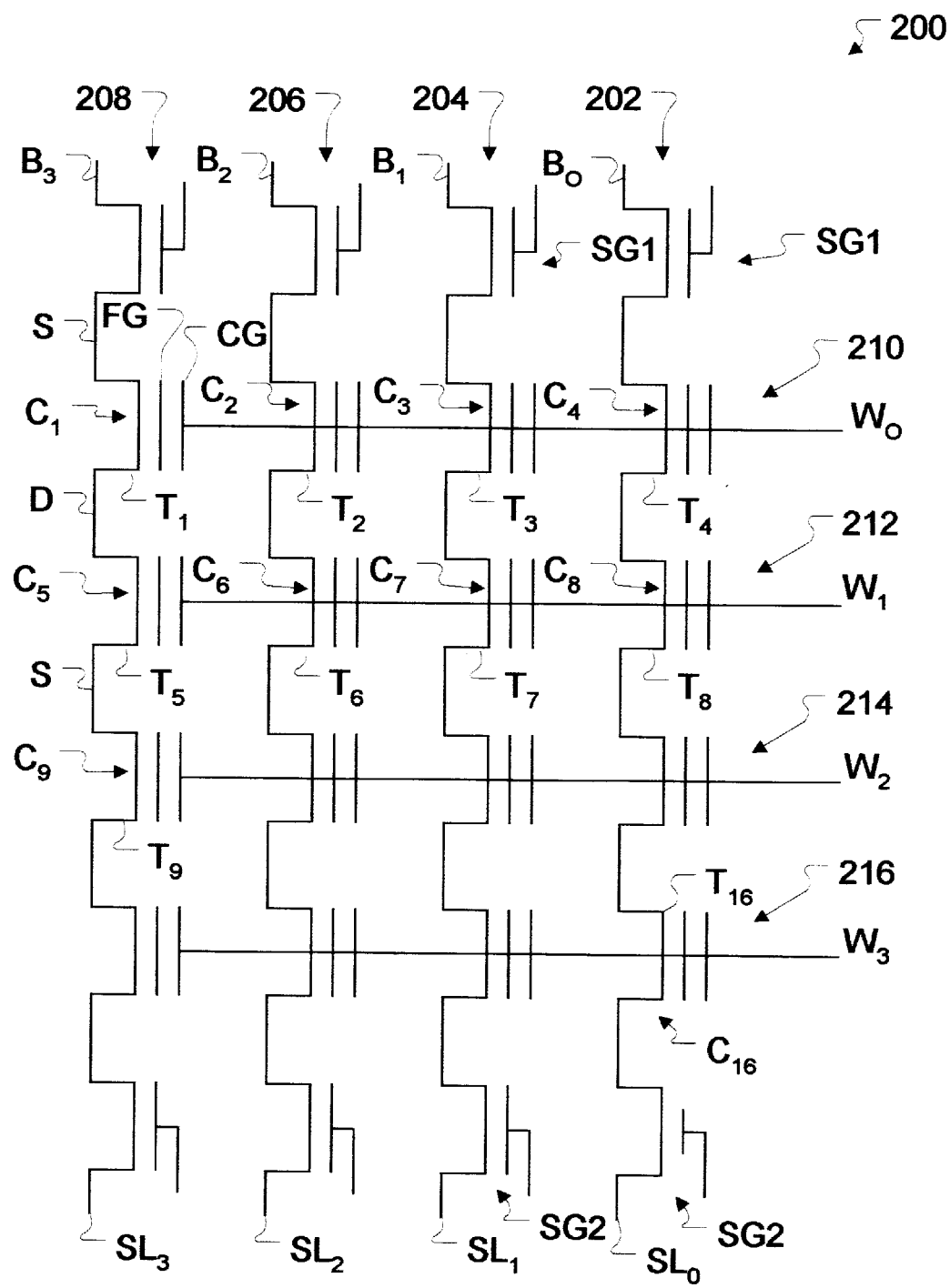
FIG. 3 is a schematic view of a typical prior art NAND memory array.

Initially, it will be seen that the problems associated with the self-aligned-source process described above are avoided. In particular, the self-aligned-source process, and the problems attendant thereto, (including optimization of Vss resistance) do not exist in the present array. In addition, by avoiding the self-aligned-source process, the manufacturing of the array is greatly simplified. Additionally, the sources of the cells are not connected to conducting lines, as in the self-aligned-source process and described above with regard to FIG. 2. With elimination of these conducting lines, spaced approximately one per 20 columns, a saving in device area of approximately five percent is achieved.

Furthermore, with the reduction in short channel effect achieved by two transistors in series, the device can be readily scaled, providing reduced spacing between word lines to the limits of the technology.

Figure 8:
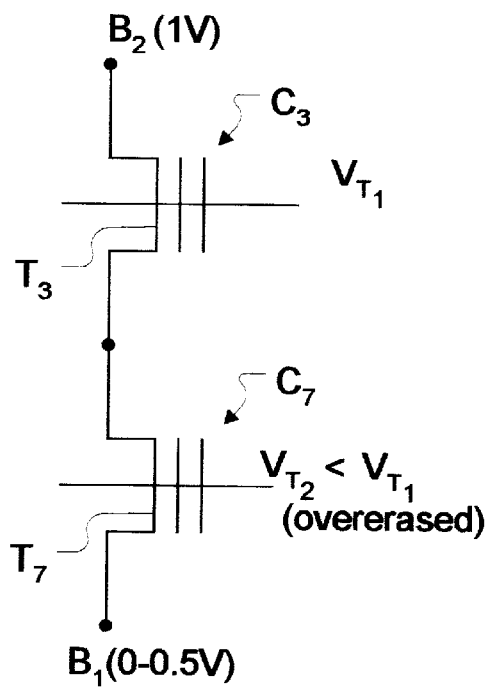
FIG. 8 is a schematic view of a series-connected pair of transistors of the array of FIG. 4, illustrating lowered column leakage.

The present array also has the advantage of reduced column leakage. With reference to FIG. 8, in order to have column leakage through both the cells C3, C7 that share adjacent bit lines and word lines, both the transistors T3, T7 thereof would have to be overerased. The probability of two such adjacent cells being overerased is very small. If indeed one of such cells is overerased and the other is not, appropriate choice of bit line voltages and erase window could be used to control leakage. Additionally, the voltage applied to bit lines other than the selected bit line can be adjusted (up to for example 0.5 V) so that leakage current through unselected cells connected to the selected bit line is shut off. This voltage can be adjusted for optimum effect. This will result in less column leakage than as described above.

In addition, typically, a prior art sector includes 512 cells connected to a common bit line, so that when selecting a cell, 511 cells connected to the bit line have the potential for providing leakage therethrough. In the present embodiment, 256 cells share a common bit line, reducing the potential for column leakage problems.

U.S. Pat. No. 5,642,311, "Overerase Correction For Flash Memory Which Limits Overerase And Prevents Erase Verify Errors", issued to Cleveland et al. on Jun. 24, 1997 (assigned to the present Assignee), teaches a method for performing an overerase correction operation which reprograms the most overerased cells to a higher threshold voltage. The method of this patent includes sensing for overerased cells and applying programming pulses thereto which bring the threshold voltages back up to acceptable values. This results in the threshold voltages of all the cells being above a minimum acceptable value. The method disclosed in the patent is referred to as Automatic Programming Disturb Erase (APDE). While the present system provides significant advantages in the area of reduced column leakage, it will be understood that a system such as APDE can be used in the present array as appropriate.

Figure 9:
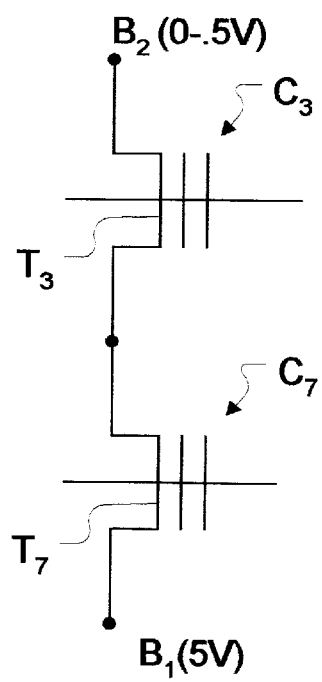
FIG. 9 is a schematic view of a series-connected pair of transistors of the array of FIG. 4, illustrating improved short channel effect.

The present array also reduces short channel effect on unselected cells (FIG. 9). Since two transistors are provided in series between bit lines, the effective channel length between voltages is doubled as compared to a single cell, i.e., the voltage is applied across two transistors in series rather than a single transistor, reducing short channel effect. Additionally, as noted, the voltage applied to bit line B2 can be increased (up to for example 0.5 V) so that leakage current is shut off This voltage can be adjusted for optimum effect.

It will also be seen that the present array provides a reduction in power requirement, because during programming of a cell, the cell in series with that cell acts as a source bias.

The present array includes the advantage that in providing the architecture of FIG. 4, conventionally straight source/drain regions are formed, with the formation of staggering metal bit lines been achieved in a straightforward manner.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
    a plurality of word lines;
    a plurality of bit lines;
    a plurality of elongated, substantially straight source/drain regions, each comprising alternating sources and drains along its length;

at least one bit line being connected to two source/drain regions in alternate manner along the bit line length.

2. The memory device of claim 1, wherein the two source/drain regions are adjacent to each other.

3. The memory device of claim 2, wherein the bit line is made up of a plurality of segments, each segment being non-aligned with an adjacent segment.

4. The memory device of claim 3, wherein the bit line is in a zigzag configuration.

5. The memory device of claim 4, wherein the source/drain regions are substantially parallel.

6. The memory device of claim 5, wherein the bit lines are orthogonal to the word lines.

7. The memory device of claim 1, wherein the bit lines are metal.

8. The memory device of claim 4, wherein the bit lines are metal.

9. A memory device comprising:
a plurality of word lines;
a plurality of bit lines;
a plurality of elongated source/drain regions, each comprising alternating sources and drains along its length;
each bit line being made up of the plurality of segments, each segment being non-aligned with an adjacent segment, each bit line being connected to two source/drain regions in alternate manner along the bit line length.

10. The memory device of claim 9, wherein each bit line is in a zigzag configuration.

11. The memory device of claim 10, wherein the source/drain regions are substantially parallel.

12. The memory device of claim 11, wherein the bit lines are orthogonal to the word lines.

13. The memory device of claim 12, wherein the bit lines are metal.

* * * * *